United States Patent
Hayashi et al.

(10) Patent No.: US 6,809,268 B2
(45) Date of Patent: Oct. 26, 2004

(54) PRINTED WIRING SUBSTRATE AND METHOD FOR FABRICATING THE SAME

(75) Inventors: Teruhisa Hayashi, Gifu (JP); Yasutake Hotta, Aichi (JP); Kouki Ogawa, Aichi (JP)

(73) Assignee: NGK Spark Plug Co., Ltd., Aichi (JP)

(*) Notice: Subject to any disclaimer, the term of this patent is extended or adjusted under 35 U.S.C. 154(b) by 346 days.

(21) Appl. No.: 09/916,689

(22) Filed: Jul. 30, 2001

(65) Prior Publication Data

US 2002/0033378 A1 Mar. 21, 2002

(30) Foreign Application Priority Data

Jul. 31, 2000 (JP) ........................................ 2000-231985

(51) Int. Cl.[7] .............................................. H05K 1/16
(52) U.S. Cl. ...................... 174/260; 174/261; 174/262; 361/760; 361/761; 361/763; 29/832
(58) Field of Search ................................ 174/260, 261, 174/262, 264, 265, 266; 361/760, 761, 762, 763, 782, 792, 793, 765, 766, 795; 257/774, 787, 789, 795, 698, 687

(56) References Cited

U.S. PATENT DOCUMENTS 5,335,139 A * 8/1994 Nomura et al. .......... 361/321.4
5,353,195 A * 10/1994 Fillion et al. ................ 361/760
5,698,904 A * 12/1997 Tsuji ............................ 257/795
5,776,551 A * 7/1998 Pasch ........................... 427/534
5,943,216 A * 8/1999 Schmidt ....................... 361/761
5,963,429 A * 10/1999 Chen ............................ 361/764
6,129,955 A * 10/2000 Papathomas et al. ........ 427/517
6,153,290 A * 11/2000 Sunahara ..................... 428/210
6,324,067 B1 * 11/2001 Nishiyama ................... 361/761
6,338,767 B1 * 1/2002 Nakatani et al. ............. 156/233

FOREIGN PATENT DOCUMENTS

| JP | 6-326472 | 11/1994 |
|----|----------|---------|
| JP | 7-263619 | 10/1995 |
| JP | 11-307687 | 11/1999 |

* cited by examiner

Primary Examiner—Evan Pert
Assistant Examiner—I B Patel
(74) Attorney, Agent, or Firm—Sughrue Mion, PLLC

(57) ABSTRACT

A printed wiring substrate 1 includes a core substrate 2 having a front surface 3 and a back surface 4 and an chip capacitor 10 serving as an electronic component embedded via a resin 13 in a through-hole 5 extending through the core substrate between the front surface 3 and the back surface 4. The chip capacitor 10 has an electrode 12 projecting from the upper and lower ends thereof. The resin 13 contains silica filler (inorganic filler) f. The maximum particle size d of the silica filler f is not greater than half the height h of the electrode 12.

8 Claims, 6 Drawing Sheets

PRINTED WIRING SUBSTRATE AND METHOD FOR FABRICATING THE SAME

BACKGROUND OF THE INVENTION

1. Field of the Invention

The present invention relates to a printed wiring substrate having electronic components embedded in a core substrate, and to a method for manufacturing the same.

2. Description of the Related Art

In response to recent requirements for high densification and high performance of a printed wiring substrate, a printed wiring substrate having electronic components embedded in a core substrate has been proposed.

For example, a printed wiring substrate 40 shown in FIG. 6 is configured such that dielectric layers 43 are formed on the corresponding front and back surfaces of a dielectric layer 41 via unillustrated wiring layers. An electronic component 45 is mounted on the first main surface of the printed wiring substrate 40. By means of a prepreg adhesive layer 47, an electronic component 44 is embedded in a through-hole 42 formed in the dielectric layer 41, the dielectric layer 41 being located at the center of the printed wiring substrate 40 in the thickness direction, and chip capacitors (electronic components) 46 are embedded in corresponding recesses 42$a$ formed in the dielectric layer 41 and extending from the interior of the dielectric layer 41 to the front surface of the dielectric layer 41.

3. Problems Solved by the Invention

In the printed wiring substrate 40, the chip capacitors 46 are embedded in the corresponding recesses 42$a$ by the thin prepreg adhesive layer 47. Thus, a crack is likely to be generated in the prepreg adhesive layer 47 in the vicinity of an electrode of the chip capacitor 46, which extends through the prepreg adhesive layer 47. Such a crack impairs dielectric capability and hermetic capability in a region peripheral to the crack, and the characteristics of the chip capacitor 46 may become unstable.

SUMMARY OF THE INVENTION

It is therefore an object of the present invention to solve the above-mentioned problems of a conventional printed wiring substrate and to provide a printed wiring substrate having an electronic component embedded in a core substrate in a condition unlikely to generate cracks, as well as to provide a method for manufacturing the same.

To achieve the above object, the present inventors investigated the addition of an inorganic filler to a resin which is used to embed an electronic component, as well the particle size of the organic filler relative to an electrode of the electronic component, to thereby achieve the present invention.

Specifically, in a first embodiment, the printed wiring substrate of the present invention comprises a core substrate having a front surface and a back surface; and an electronic component embedded via a resin in a through-hole extending through the core substrate between the front surface and the back surface of the core substrate. The printed wiring substrate is characterized in that the electronic component has an electrode projecting from at least either an upper end or a lower end thereof and the resin contains an inorganic filler.

In a second embodiment, the printed wiring substrate of the present invention comprises a core substrate having a front surface and a back surface; and an electronic component embedded via a resin in a recess formed in the core substrate and extending from interior of the core substrate to the front surface or the back surface of the core substrate. The printed wiring substrate is characterized in that the electronic component has an electrode projecting from at least either an upper end or a lower end thereof and the resin contains an inorganic filler.

According to the present invention, the inorganic filler reinforces the resin and lowers the coefficient of thermal expansion of the resin. Thus, no cracks are generated in the resin used to embed an electronic component. Particularly, cracking or separation is unlikely to occur at a thin resin portion adjacent to the upper or lower end of an electronic component from which an electrode projects. Thus, an electronic component can be embedded in a through-hole or a recess formed in the core substrate such that good dielectric performance and good hermetic performance are maintained. Accordingly, the electronic component can reliably function as expected, and electrical continuity can be stably established via the electrode between the electronic component and a wiring layer formed in the printed wiring substrate.

In a third embodiment, the printed wiring substrate of the present invention comprises a core substrate having a front surface and a back surface; and an electronic component embedded in the core substrate. The printed wiring substrate is characterized in that the electronic component has an electrode projecting from at least either an upper end or a lower end thereof and the core substrate contains an inorganic filler. Since the core substrate, in which an electronic component is embedded, contains a reinforcing inorganic filler, no cracks are generated in a portion of the core substrate around the electronic component. Particularly, cracking or separation becomes unlikely to occur at a thin portion of the core substrate adjacent the upper or lower end of the electronic component from which the electrode projects. Thus, the electronic component can be embedded in the core substrate such that good dielectric performance and good hermetic performance are maintained. Accordingly, the electronic component can reliably function as expected, and electrical continuity can be stably established via the electrode between the electronic component and a wiring layer formed in the printed wiring substrate.

Examples of the above-mentioned electronic component include passive components, such as capacitors, inductors, filters, and resistors; active components, such as low noise amplifiers (LNAs), transistors, semiconductor devices, and FETs; as well as SAW filters, LC filters, antenna switch modules, couplers, and diplexers. Also included are these electronic components in the form of chips, and electronic component units each composed of a plurality of these electronic components in the form of chips. Among these electronic components, electronic components of different types may be embedded in the same through-hole or recess.

Examples of the inorganic filler include crystalline silica, fused silica, alumina, and silicon nitride. However, the present invention is not limited thereto. The inorganic filler is generally added in an amount of 35–65 vol. %, preferably from 40 to 60 vol. %, and more preferably from 40 to 50 vol. %. These amounts are for the content of the inorganic filler in both the resin and core substrate.

Through addition of the above-mentioned inorganic filler to the resin, the resin can assume a coefficient of thermal expansion of not greater than 40 ppm/° C. (zero is not included), preferably not greater than 30 ppm/° C. (zero is not included), more preferably not greater than 25 ppm/° C.

(zero is not included), further preferably not greater than 20 ppm/° C. (zero is not included). Thus, stress concentration derived from the difference in coefficient of thermal expansion between the resin and an embedded electronic component can be reduced. In the above ranges of coefficient of thermal expansion, the lower limit is preferably not less than 10 ppm/° C.

In yet a fourth embodiment, the present invention provides a printed wiring substrate wherein the particle size of the inorganic filler is not greater than one-half the height of the electrode (zero is not included).

Employing the above mentioned particle size reinforces a thin resin portion or a thin portion of the core substrate adjacent to the upper or lower end of an electronic component from which an electrode projects, thereby preventing cracking or separation of the thin portion which would otherwise result from thermal expansion or contraction. Usually, an inorganic filler is unlikely to reach a thin portion of resin or core substrate adjacent to the upper or lower end of an electronic component from which an electrode projects. However, according to the present invention, since the particle diameter of the inorganic filler is relatively small as compared with the height of the electrode, the inorganic filler reliably and uniformly reaches the thin portions. Thus, the thin portions contain a sufficient amount of inorganic filler, thereby establishing uniform distribution of the coefficient of thermal expansion and thus preventing the occurrence of cracking.

When a wiring layer is to be formed on the upper and lower sides of the core substrate by way of a build-up process, the surface of the resin is roughened with an oxidizer. In the case of the printed wiring substrate of the present invention, uniform distribution of the inorganic filler allows uniform roughening of the resin. Thus, reliable adhesion can be established between the surface of the resin used for embedding an electronic component, and a wiring layer formed on the surface of the resin. The particle size of an inorganic filler denotes the maximum particle size in a particle-size distribution of the inorganic filler.

When the maximum particle size in a particle-size distribution of an inorganic filler is in excess of one-half the height of an electrode, cracking becomes likely to occur; thus, inorganic-filler particles greater than one-half the height of an electrode are eliminated. More preferably, the particle size of an inorganic filler is not greater than one-third the height of an electrode (zero is not included). Preferably, the shape of an inorganic-filler particle is substantially spherical in order to enhance the fluidity and packing density of the resin and a material for the core substrate. However, an inorganic-filler particle may be shaped such that a cross section thereof assumes the form of an ellipse having a major axis and a minor axis. Preferably, in order to attain low viscosity and high packing density of the resin, two or more kinds of inorganic fillers of different average particle sizes and particle shapes are used in combination.

In a fifth embodiment, the present invention provides a printed wiring substrate wherein the particle size of the inorganic filler is not greater than 25 µm, and the height of the electrode is not lower than 50 µm.

Employing the above mentioned particle size and electrode height appropriately reinforces a thin resin portion or a thin portion of the core substrate adjacent to the upper or lower end of an electronic component from which an electrode projects, thereby reliably preventing cracking or separation. A particle size of not greater than 25 µm means that the maximum particle size in a particle-size distribution is not greater than 25 µm (zero is not included).

When the particle size of a filler (e.g., silica filler) is in excess of 25 µm, cracking is likely to occur in the thin resin portion mentioned above; thus, particle sizes greater than 25 µm are excluded. Preferably, the particle size is not greater than 20 µm (zero is not included). In order to attain fluidity of the resin, the lower limit of the particle size of the filler is 0.1 µm or greater, preferably not lower than 0.5 µm. Herein, the particle size is measured in the following manner. A projected image of a particle obtained by means of a laser diffractometer is approximated to a circle. The diameter of the circle is measured for use as the size of the particle.

When the height of the electrode is less than 50 µm, cracking as mentioned above is likely to occur; thus, electrode heights less than 50 µm are excluded. Preferably, in order to prevent a short circuit between electrodes, the upper limit of the height of an electrode is 100 µm or less (zero is not included). The surface roughness of the electrode of an electronic component is 0.3–20 µm in terms of 10-point average roughness Rz, preferably 0.5–10 µm, more preferably 0.5–5 µm. Such a range of surface roughness of an electrode allows the resin to be caught by pits and projections on the surface of the electrode, thereby yielding an anchoring effect and thus enhancing adhesion. No particular limitation is imposed on the method for controlling the surface roughness. Examples of such a surface-roughening method include chemical etching, micro-etching, and blackening.

The present invention also provides a method for manufacturing a printed wiring substrate adapted to manufacture a printed wiring substrate comprising a core substrate having a front surface and a back surface and an electronic component embedded via a resin in a through-hole extending through the core substrate between the front surface and back surface of the core substrate or in a recess formed in the core substrate and extending from the interior of the core substrate to the front surface or the back surface. The method comprises the steps of: inserting into the through-hole or the recess the electronic component having an electrode projecting from at least either an upper end or a lower end thereof; embedding the electronic component in the through-hole or the recess by means of a resin containing an inorganic filler; and polishing a surface of the resin for leveling so as to expose an end surface of the electrode.

The method of the present invention reinforces a thin resin portion or a thin portion of the core substrate adjacent to the upper or lower end of an electronic component from which an electrode projects, thereby reliably providing a printed wiring substrate that is not susceptible to cracking. Also, since the thin resin portion adjacent to the upper or lower end of the electronic component is reliably filled with the inorganic filler, cracking is unlikely to occur in that portion. Thus, a printed wiring substrate having electronic components embedded in a core substrate can be reliably manufactured. Herein, the term "embed" means, for example, to mount in place through embedding by means of the resin mentioned above, and the term "leveling" means, for example, to finish the surface of the resin to a substantially flat surface.

Additionally, the manufacturing method mentioned above can be a method for manufacturing a printed wiring substrate comprising a core substrate having a front surface and a back surface and an electronic component embedded via a resin in a through-hole extending through the core substrate between the front surface and back surface of the core substrate or in a recess formed in the core substrate and extending from interior of the core substrate to the front surface or the back surface. The method comprises the steps of: inserting into the through-hole or the recess the electronic component having an electrode projecting from at least either an upper end or a lower end thereof; embedding the electronic component in the through-hole or the recess by means of a resin containing an inorganic filler whose particle size is not greater than half the height of the electrode; and polishing a surface of the resin for leveling so as to expose an end surface of the electrode. Preferably, the particle size of the inorganic filler is not greater than one-third the height of the electrode. Notably, the particle size of the inorganic filler is not greater than one-half the height of the electrode after polishing.

Additionally, the present invention provides a method for manufacturing a printed wiring substrate comprising a core substrate having a front surface and a back surface and an electronic component embedded via a resin in a through-hole extending through the core substrate between the front surface and back surface of the core substrate or in a recess formed in the core substrate and extending from the interior of the core substrate to the front surface or the back surface. The method comprises the steps of: inserting into the through-hole or the recess the electronic component having an electrode projecting not less than 50 μm and less than 100 μm from at least either an upper end or a lower end thereof; embedding the electronic component in the through-hole or the recess by means of a resin containing an inorganic filler whose particle size is not greater than 25 μm; and polishing a surface of the resin for leveling so as to expose an end surface of the electrode. Since this method allows the inorganic filler to be reliably filled into a thin resin portion adjacent the upper or lower end of the electronic component, cracking is unlikely to occur in the portion. Thus, a printed wiring substrate having electronic components embedded in a core substrate can be reliably manufactured.

Figure 1:
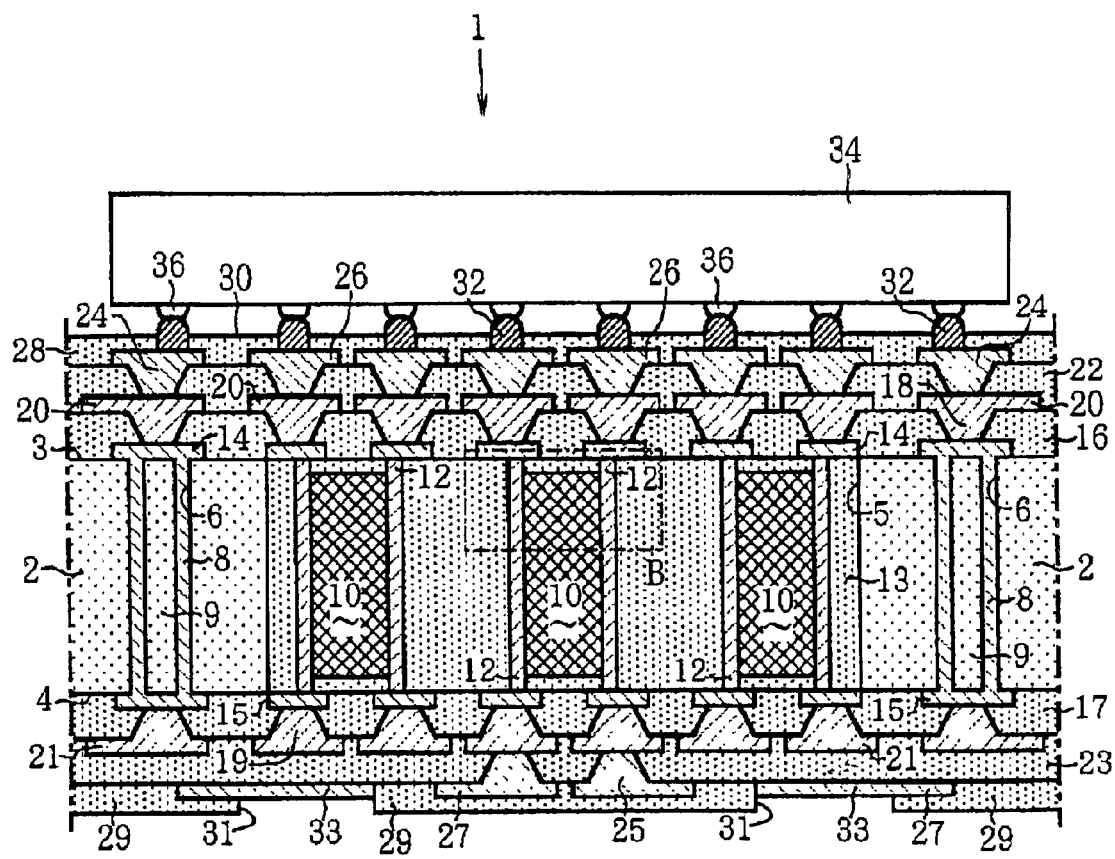
FIG. 1(A) is a sectional view showing a main portion of a printed wiring substrate according to an embodiment of the present invention.
FIG. 1(B) is an enlarged view of portion B enclosed by the dot-and-dash line in FIG. 1(A).
Figure 1:
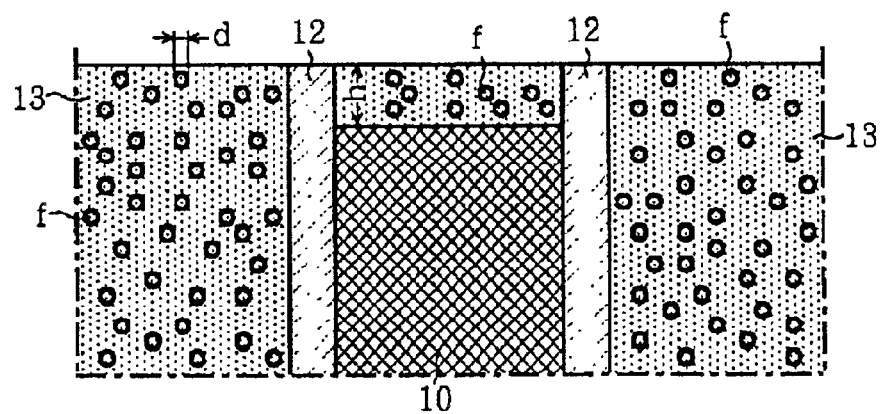

DESCRIPTION OF REFERENCE NUMERALS 1, 1a–1c: printed wiring substrates
2: core substrate
3: front surface
4: back surface
5: through-hole
5a, 5c: recesses
10: chip capacitor (electronic component)
12: electrode
13: resin
f: silica filler (inorganic filler)
d: maximum particle size (particle size) of silica filler
h (h1, h2): height of electrode

DETAILED DESCRIPTION OF THE PREFERRED EMBODIMENTS

Embodiments of the present invention will next be described in detail with reference to the drawings. However, the present invention should not be construed as being limited thereto.

FIG. 1(A) is a sectional view showing a main portion of a printed wiring substrate 1 according to an embodiment of the present invention.

As shown in FIG. 1(A), the printed wiring substrate 1 is a multilayer substrate including a core substrate 2, wiring layers 14, 20, and 26 and dielectric layers 16, 22, and 28 built up on a front surface 3, and wiring layers 15, 21, and 27 and dielectric layers 17, 23, and 29 built up on a back surface 4.

The core substrate 2 assumes a substantially square shape as viewed from above and a thickness of approximately 0.8 mm and is made of bismaleimide triazine (BT) resin. As shown in FIG. 1(A), a through-hole 5 having a substantially square shape of 12 mm×12 mm as viewed from above is punched in the core substrate 2 at a central portion thereof. Through-holes 6 are formed in the core substrate 2 at the opposite sides of (around) the through-hole 5 so as to extend between the front surface 3 and the back surface 4. A through-hole conductor 8 filled with a filler resin 9 is formed inside each of the through-holes 6.

A plurality of chip capacitors (electronic components) 10 are embedded via an epoxy resin 13 in the through-hole 5 formed in the core substrate 2. The chip capacitors 10 each have a plurality of electrodes 12 projecting from the upper and lower ends thereof. The chip capacitor 10 is a ceramics capacitor configured such that Ni layers and dielectric layers containing a predominant amount of, for example, barium titanate are arranged in alternating layers. The chip capacitor 10 measures 3.2 mm×1.6 mm×0.7 mm.

As shown in FIG. 1(B), the resin 13 used for embedding the chip capacitors 10 contain a silica filler (inorganic filler) f having a maximum particle size d of approximately 20–25 μm and an average particle size of 4 μm such that silica filler particles are distributed in a substantially uniform condition without mutual contact. The height h of the electrode 12 projecting from the upper (lower) end of the chip capacitor 10 is 75 μm. The electrode 12 is coated with a copper plating layer by barrel plating. The maximum particle size d of the silica filler f is not greater than one-half the height h of the electrode 12, preferably not greater than one-third the height h.

Thus, the silica filler f readily enters even a thin resin portion extending between the upper or lower end of the chip capacitor 10 and the surface of the resin 13. Accordingly, the thin resin portion does not suffer lack of the silica filler f. The silica filler f serves as an aggregate to reinforce the resin 13 and lowers the coefficient of thermal expansion of the resin 13 (a coefficient of thermal expansion of not greater than 30 ppm/° C.). Thus, cracking is unlikely to occur in a thin portion of the resin 13 located in the vicinity of the electrodes 12 extending through the resin 13, whereby the chip capacitors 10 can be embedded in the core substrate 2 while being insulated and hermetically sealed.

As shown in FIG. 1(A), the wiring layer 14 formed by copper plating and the dielectric layer 16 made of epoxy resin are formed on the front surface 3 of the core substrate 2. Also, the wiring layer 14 is formed on the upper end of the through-hole conductor 8. A filled via conductor 18 connected to the wiring layer 14 is formed on the dielectric layer 16 at a predetermined position. The wiring layer 20 is formed on the upper end of the filled via conductor 18 and on the dielectric layer 16. Similarly, the dielectric layer 22 and a filled via conductor 24 are formed on the wiring layer 20. Also, the wiring layer 26 is formed on the upper end of the filled via conductor 24 and on the dielectric layer 22. A solder resist layer (dielectric layer) 28 is formed on the wiring layer 26. A plurality of solder bumps (IC connection terminals) 32 are formed on the wiring layer 26 in such a manner as to extend through the solder resist layer 28 and to project beyond a first main surface 30. The solder bumps 32 are connected to corresponding connection terminals 36 projecting from the bottom surface of an IC chip 34 to be mounted later on the first main surface 30.

A space between the bottom surface of the IC chip 34 and the first main surface 30 is filled with an under fill material so as to embed the solder bumps 32 and the connection terminals 36 within the material.

As shown in FIG. 1(A), the wiring layer 15 formed by copper plating and the dielectric layer 17 made of epoxy resin are formed on the back surface 4 of the core substrate 2. Also, the wiring layer 15 is formed on the lower end of the through-hole conductor 8. A filled via conductor 19 connected to the wiring layer 15 is formed on the dielectric layer 17 at a predetermined position. The wiring layer 21 is formed on the lower end of the filled via conductor 19 and on the dielectric layer 17. Similarly, the dielectric layer 23 and a filled via conductor 25 are formed on the wiring layer 21. Also, the wiring layer 27 is formed on the lower end of the filled via conductor 25 and on the dielectric layer 23. A solder resist layer (dielectric layer) 29 is formed on the wiring layer 27. The surface of a portion of the wiring layer 27 exposed within an opening portion 31 of the solder resist layer 29; i.e., the surface of a wiring pattern 33, is covered with an Au plating film and an Ni plating film so as to serve as a connection terminal for connection to an unillustrated motherboard, such as an unillustrated printed circuit board, on which the printed wiring substrate 1 is to be mounted.

An unillustrated pin of iron alloy or copper alloy may be connected to the surface of the wiring pattern 33 by means of Sn—Sb solder (alloy of low melting point). The wiring layers 14, 20, 26, 15, 21 and 27, the dielectric layers 16, 22, 28, 17, 23, and 29, and the filled via conductors 18, 24, 19, and are formed by a known build-up process (semi-additive process, full additive process, subtractive process, photolithography, laser beam machining for formation of a via hole, etc.).

As shown in FIG. 1(A), a plurality of electrodes 12 project by the height h, as in the case mentioned previously, from the lower end of each of the chip capacitors 10 in such a manner as to extend through the resin 13 filled in the through-hole 5. The maximum particle size d of the silica filler f contained in the resin 13 is not greater than one-half the height h, preferably not greater than one-third the height h.

According to the printed wiring substrate 1 described above, the chip capacitors 10 are embedded in the through-hole 5 formed in the core substrate 2 via the resin 13 containing the silica filler f, and the maximum particle size d of the silica filler f is not greater than one-half the height h of the electrode 12 of the chip capacitor 10. Thus, cracking in or separation of a portion of the resin 13 located in the vicinity of the electrodes 12 is unlikely to occur. Thus, since the chip capacitors 10 can be embedded in the core substrate 2 while being insulated and hermetically sealed, the chip capacitors 10 can reliably function and can be electrically connected, in a stable condition, to the wiring layers 14 and 15 and the IC chip 34 via the electrodes 12.

The above embodiment is described while mentioning the core substrate 2 formed from a single-layer dielectric plate. However, the present invention is not limited thereto. The core substrate 2 may be configured such that a plurality of dielectric layers are arranged in a layered structure or such that a plurality of dielectric layers and a plurality of wiring layers are arranged in an alternatingly layered structure. The plurality of dielectric layers may be made of one or more materials. The chip capacitors 10 embedded in the core substrate 2 may be such that the electrodes 12 project from the upper end thereof. When the chip capacitors 10 assume such a form, the chip capacitors 10 are electrically connected to wiring layers formed on and under the back surface 4, such as the wiring layer 15, via the through-hole conductors 8 extending through the core substrate 2.

FIG. 2 shows major steps of a method for manufacturing the printed wiring substrate 1 described above.

Figure 2A:
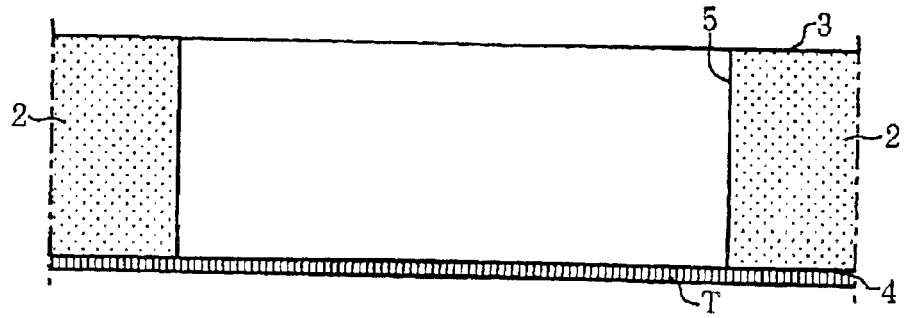
FIGS. 2(A) to 2(D) are schematic views showing major steps of a method for manufacturing the printed wiring substrate of FIG. 1(A).
Figure 2B:
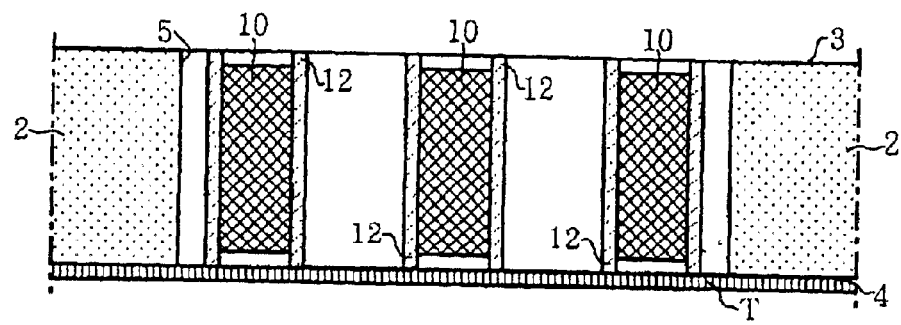

FIG. 2(A) shows the core substrate 2 in which a through-hole 5 having a substantially square shape of 12 mm×12 mm as viewed from above is punched in such a manner as to extend therethrough between the front surface 3 and the back surface 4, while a tape T is affixed to the back surface 4 of the core substrate 2. Notably, FIG. 2(A) shows one of core substrates 2 before the core substrates 2 to which the tape T is affixed are cut out from a panel. The adhesive surface of the tape T faces the through-hole 5. Next, as shown in FIG. 2(B), a plurality of chip capacitors 10 each having electrodes 12 projecting 75 μm from the upper and lower ends thereof are inserted into the through-hole 5 by means of a chip mounter such that the lower ends of the electrodes 12 are affixed to the adhesive surface of the tape T.

Figure 2C:
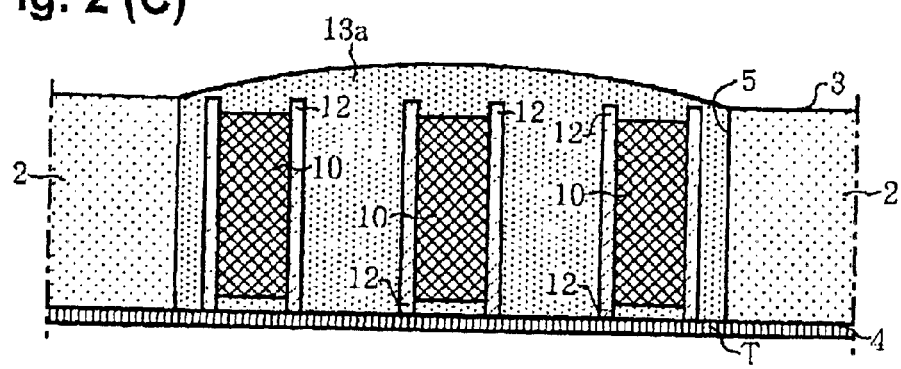

Next, as shown in FIG. 2(C), a liquid epoxy resin 13a is filled into the through-hole 5 from above the front surface 3 of the core substrate 2 by use of an unillustrated dispenser. An example of the epoxy resin 13a is bisphenol epoxy resin or naphthalene type epoxy resin. Alternatively, the resin can be, for example, a phenol novolac resin. The resin 13a contains the silica filler f having a maximum particle size of approximately 20–25 μm and an average particle size of 4 μm. In order to enhance wettability with the resin 13a and fluidity of the resin 13a, particles of the silica filler f are surface-treated with a coupling agent such as a silane type, a titanate type, or an aluminate type coupling agent. A liquid curing agent such as an imidazole type, an amine type, a novolak type, or an acid anhydride type curing agent is added to the liquid epoxy resin 13a so as to lower the viscosity of the resin 13a and to facilitate addition of the silica filler f.

More particularly, when the fluidity of the resin is taken into consideration, the use of one or more additives to the resin is preferred among the bisphenol type epoxy resin or naphthalene type epoxy resin, and phenol novolac resin. The fluidity of the embedding resin is such that it results in poor filling of the resin between electrodes of electronic components, thereby resulting in local unevenness of the thermal expansion coefficient. When adhesion intensity, heat resistance and moisture resistance are especially taken into consideration, the naphthalene type epoxy resin is preferred as the resin 13a or 13.

An acid anhydride is preferably used as the curing agent. This is because the viscosity of the an epoxy resin can be further lowered using an acid anhydride, and because the inorganic filler can be added at a high rate (i.e., large content) so as to lower the thermal expansion coefficient of the embedding resin since it has a low viscosity. Furthermore, fluidity increases and the filling of the resin between the electrodes of electronic components can also be approved. Moreover, the addition of a hardening catalyst, for example, an imidazole type hardening catalyst, is preferred because heat resistance can be further increased.

A method for filling the liquid epoxy resin 13a into the through-hole 5 and filling up the gap between the chip capacitors 10 and the wall of the through-hole 5 is not limited to the above-mentioned method using a dispenser. A known injection method or coating method, such as screen printing or roll coating, can be used instead.

After the resin 13a is filled into the through-hole 5, the core substrate is heated to a temperature of 80–180° C. so as to cure the resin 13a. Curing is performed in two stages; specifically, primary heating to a temperature of 80–120° C. and secondary heating to a temperature of 120–180° C. Primary heating effectively defoams the resin 13a present in a gap between the chip capacitors 10 and the wall of the through-hole 5 and the resin 13a present between the electrodes 12. Secondary heating cures the defoamed resin 13a.

Figure 2D:
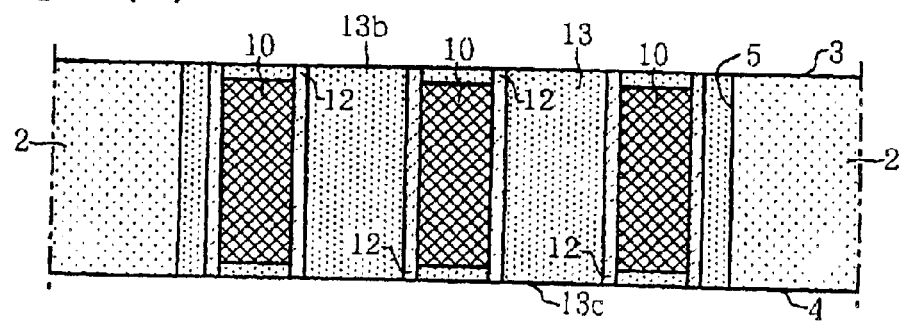

The swollen surface of the cured resin 13 is polished with a belt sander and is then finished through lapping to level the substrate. As a result, as shown in FIG. 2(D), the surface of the resin 13 corresponding to the front surface 3 of the core substrate becomes a flat surface 13b such that the upper end surfaces of the electrodes 12 of the chip capacitors 10 are exposed at the flat surface 13b. After the tape T is removed, the surface of the resin 13 corresponding to the back surface 4 of the core substrate 2 is polished to become a flat surface 13c, thereby reliably exposing the lower end surfaces of the electrodes 12 of the chip capacitors 10. After polishing, the electrodes 12 have a height h of 75 $\mu$m.

Subsequently, the wiring layers 14 and 15 to be connected to the electrodes 12 are formed on the front surface 3 and the back surface 4, respectively, of the core substrate 2 by photolithography. Then, the wiring layers 20, 26, 21, and 27, the dielectric layers 16, 22, 28, 17, 23, and 29, and the filled via conductors 18, 24, 19, and 25 are formed by a known build-up process (a subtractive process in the present embodiment). Thus, the printed wiring substrate 1 is obtained whose major portions are shown in FIG. 1(A).

EXAMPLES

Specific examples of the printed wiring substrate 1 of the present invention, together with comparative examples, will next be described. However, the present invention should not be construed as being limited thereto.

As shown in Table 1, the printed wiring substrate 1 of Example 1 was manufactured in the following manner. The chip capacitor 10 having an electrode height h1 of 75 $\mu$m was embedded in the through-hole 5 formed in the core substrate 2 using the resin 13 containing in an amount of 73 wt % the silica filler f having a maximum particle size d of 20 $\mu$m and an average particle size of 4 $\mu$m in a particle-size distribution. Subsequently, the front and back surfaces of the resin 13 were polished for leveling, to thereby obtain an electrode height h2 of 60 $\mu$m. The printed wiring substrate 1 of Example 2 was manufactured in a manner similar to that of Example 1, except that the maximum particle size of the silica filler f was 25 $\mu$m.

As shown in Table 1, a printed wiring substrate of Comparative Example 1 was manufactured in the following manner. The chip capacitor 10 having an electrode height h1 of 75 $\mu$m was embedded in the through-hole 5 formed in the core substrate 2 using the resin 13 containing in an amount of 80 wt % the silica filler f having a maximum particle size d of 35 $\mu$m and an average particle size of 20 $\mu$m. Subsequently, the front and back surfaces of the resin 13 were polished for leveling, to thereby obtain an electrode height h2 of 60 $\mu$m.

TABLE 1

|  | Particle Size d of Inorganic Filler f | Electrode Height h1 before Polishing | d/h1 | Electrode Height h2 after Polishing | d/h2 | Cracking or Defect |
|---|---|---|---|---|---|---|
| Example 1 | 20 $\mu$m | 75 $\mu$m | 0.266 | 60 $\mu$m | 0.333 | ○ (No) |
| Example 2 | 25 $\mu$m | 75 $\mu$m | 0.333 | 60 $\mu$m | 0.416 | ○ (No) |
| Compar. Example 1 | 35 $\mu$m | 75 $\mu$m | 0.466 | 60 $\mu$m | 0.583 | X (Yes) |

The printed wiring substrates (1) of Examples 1 and 2 and Comparative Example 1 were examined for the condition of a portion of the resin 13 located in the vicinity of the electrodes 12 and adjacent to the upper and lower ends of the chip capacitor 10. Examples 1 and 2 exhibited no occurrence of cracking and separation. By contrast, Comparative Example 1 showed occurrence of cracking. The test results reveal that Examples 1 and 2 show uniform distribution of the silica filler f even in a portion of the resin 13 located in the vicinity of the electrodes 12, whereas Comparative Example 1 conceivably suffered nonuniform distribution of the silica filler f, particularly in a thin portion of the resin 13 located on the tape T side. The test results demonstrate the advantage in employing a ratio d/h2 of not greater than 0.5, wherein d is the maximum particle size of the silica filler f and h2 is the height of the electrode 12 measured after polishing; i.e., the advantage in employing a maximum particle size d of the silica filler f not greater than one-half the height h2 of the electrode 12.

The test results also demonstrate that the silica filler f readily reaches the thin portion of the resin 13 by employing a ratio d/h1 of less than 0.466 in the case of Comparative Example 1, wherein d is the maximum particle size of the silica filler f and h1 is the original height of the electrode 12; i.e., by employing a maximum particle size d of the silica filler f not greater than nine-twentieth (0.45) the height hi of the electrode 12.

Next, as shown in Table 2, a plurality of printed wiring substrates (1) were manufactured in the following manner. A plurality of chip capacitors 10 having an electrode height h2 of 15 $\mu$m, 50 $\mu$m, 80 $\mu$m, 100 $\mu$m and 120 $\mu$m measured after polishing were embedded in the respective through-holes 5 formed in the core substrates 2 of the same type, using the resin 13 containing the silica filler f having a maximum particle size d of 20 $\mu$m. Subsequently, the front and back surfaces of the resin 13 were polished for leveling, to thereby obtain a plurality of printed wiring substrates (1).

TABLE 2

| | Particle Size d of Inorganic Filler f | Electrode Height h2 after Polishing | d/h2 | Cracking or Defect |
|---|---|---|---|---|
| Example 3 | 20 μm | 50 μm | 0.10 | ◯ (No) |
| Example 4 | 20 μm | 80 μm | 0.25 | ◯ (No) |
| Example 5 | 20 μm | 100 μm | 0.20 | ◯ (No) |
| Example 6 | 20 μm | 120 μm | 0.166 | ◯ (No) |
| Compar. Example 2 | 20 μm | 15 μm | 1.33 | X (Yes) |

In the case of the printed wiring substrates 1 of Examples 3–6, after the resin 13 was polished for leveling to thereby attain a electrode height h2 of 50–120 μm, no cracking was observed in the resin 13. Also, no floating or exfoliation of the resin 13 was observed after a plating process including surface roughening was carried out.

By contrast, in the case of Comparative Example 2, after the resin 13 was polished for leveling to thereby attain an electrode height h2 of 15 μm, cracking was observed in the resin 13, and the body of the chip capacitor 10 was exposed through the crack. Furthermore, floating or exfoliation of the resin 13 was observed after a plating process was carried out. In the case of the printed wiring substrate of Example 6 having an electrode height h of 120 μm, a short circuit between the electrodes 12 was observed after the plating process.

The test results demonstrate the advantage of employing a ratio d/h2 of not greater than 0.5, wherein d is the maximum particle size of the silica filler f and h2 is the height of the electrode 12 measured after polishing; i.e., the advantage in employing a maximum particle size d of the silica filler f not greater than one-half the height h2 of the electrode 12.

As readily understood from the test results regarding the printed wiring substrates 1 of Examples 1–6, there is an advantage in employing a maximum particle size of the silica filler f of not greater than 25 μm and a height h of the electrode 12 of not less than 50 μm (preferably not greater than 100 μm) for the chip capacitor 10 that is to be embedded.

Figure 3:
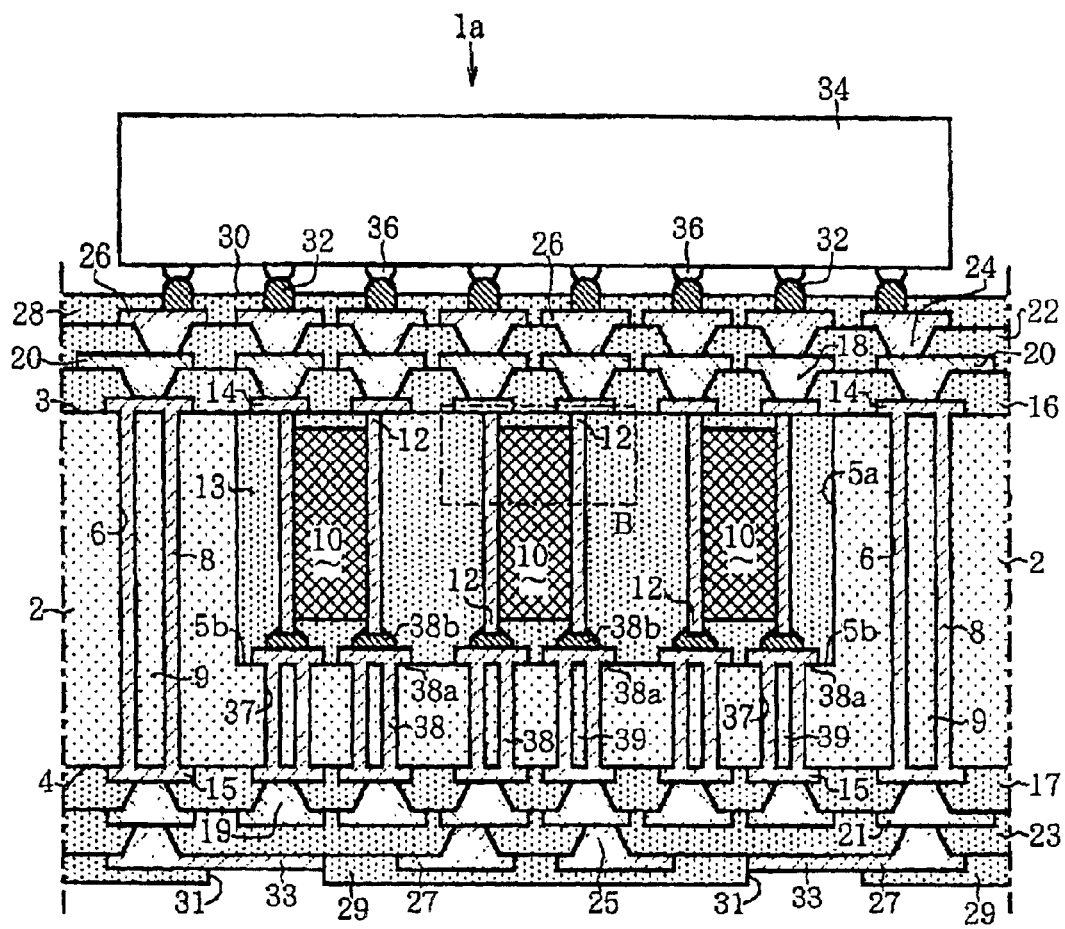
FIG. 3(A) is a sectional view showing a main portion of a printed wiring substrate according to a modification of the printed wiring substrate of FIG. 1(A)
FIG. 3(B) is an enlarged view of portion B enclosed by the dot-and-dash line in FIG. 1(A).
Figure 3:
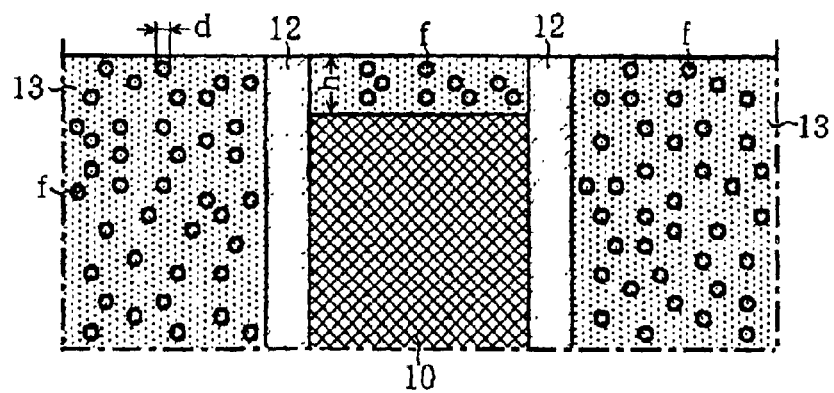

FIG. 3(A) is a sectional view showing a main portion of a printed wiring substrate 1a, or a modification of the printed wiring substrate 1 described above. Structural portions and elements similar to those of the above-described embodiment are denoted by common reference numerals.

A recess 5a having a substantially square shape of 12 mm×12 mm as viewed from above is formed, by means of a router, in the core substrate 2 of the printed wiring substrate 1a so as to extend from the interior of the core substrate 2 to the front surface 3. Through-holes 37 are formed in a portion of the core substrate 2 between a bottom surface 5b of the recess 5a and the back surface 4 of the core substrate 2. A through-hole conductor 38 filled with a filler resin 39 is formed inside each of the through-holes 37. A pad 38a is formed at the upper end of the through-hole conductor 38 and on the bottom surface 5b of the recess 5a. The pads 38a are connected via a solder 38b to the corresponding electrodes 12 projecting from the bottom end of the chip capacitors 10. As in the case of the embodiment described previously, the wiring layer 15 is disposed on the lower ends of the through-hole conductors 38 and on the back surface 4 of the core substrate 2.

A plurality of chip capacitors 10 are disposed in the recess 5a such that the electrodes 12 projecting from the lower ends thereof are connected to the corresponding pads 38a via the solder 38b. Subsequently, as in the case of the embodiment described previously, the liquid epoxy resin 13a containing the silica filler f is filled into the recess 5a, followed by curing by application of heat. The liquid epoxy resin 13a becomes the resin 13. The surface of the resin 13 is polished for leveling in a manner similar to that of the previously described embodiment. Subsequently, as shown in FIG. 3(A), the wiring layers 14, 20, 26, 15, 21, and 27, the dielectric layers 16, 22, 28, 17, 23, and 29, and the filled via conductors 18, 24, 19, and 25 are formed by a known build-up process, thereby yielding the printed wiring substrate 1a.

As shown in FIG. 3(B), the resin 13 used for embedding the chip capacitors 10 contains the silica filler f having a maximum particle size d of approximately 25 μm such that silica filler particles are distributed in a substantially uniform condition. The height h of the electrode 12 projecting from the upper end of the chip capacitor 10 is 80 μm. The maximum particle size d of the silica filler f is not greater than one-third the height h of the electrode 12.

Thus, even in a thin resin portion extending between the upper end of the chip capacitor 10 and the surface of the resin 13, lack of the silica filler f does not occur, and the silica filler f serves as an aggregate to reinforce the resin 13 and lowers the coefficient of thermal expansion of the resin 13. Accordingly, a thin portion of the resin 13 located in the vicinity of the electrodes 12 is unlikely to suffer cracking and separation, whereby the chip capacitors 10 can be embedded in the core substrate 2 while being insulated and hermetically sealed. Similarly, the electrodes 12 project by the height h from the lower end of each of the chip capacitors 10. The solder 38b and the electrodes 12 projecting from the lower ends of the chip capacitors 10 establish a sufficient gap between the chip capacitors 10 and the bottom surface 5b of the recess 5a, whereby the silica filler f is likely to enter the gap. In FIG. 3(A), the electrodes 12 projecting from the lower ends of the chip capacitors 10 are connected to the corresponding pads 38a via the solder 38b. However, the form of connection is not limited thereto. For example, the electrodes 12 projecting from the lower ends of the chip capacitors 10 may be directly connected to the corresponding pads 38a.

Figure 4:
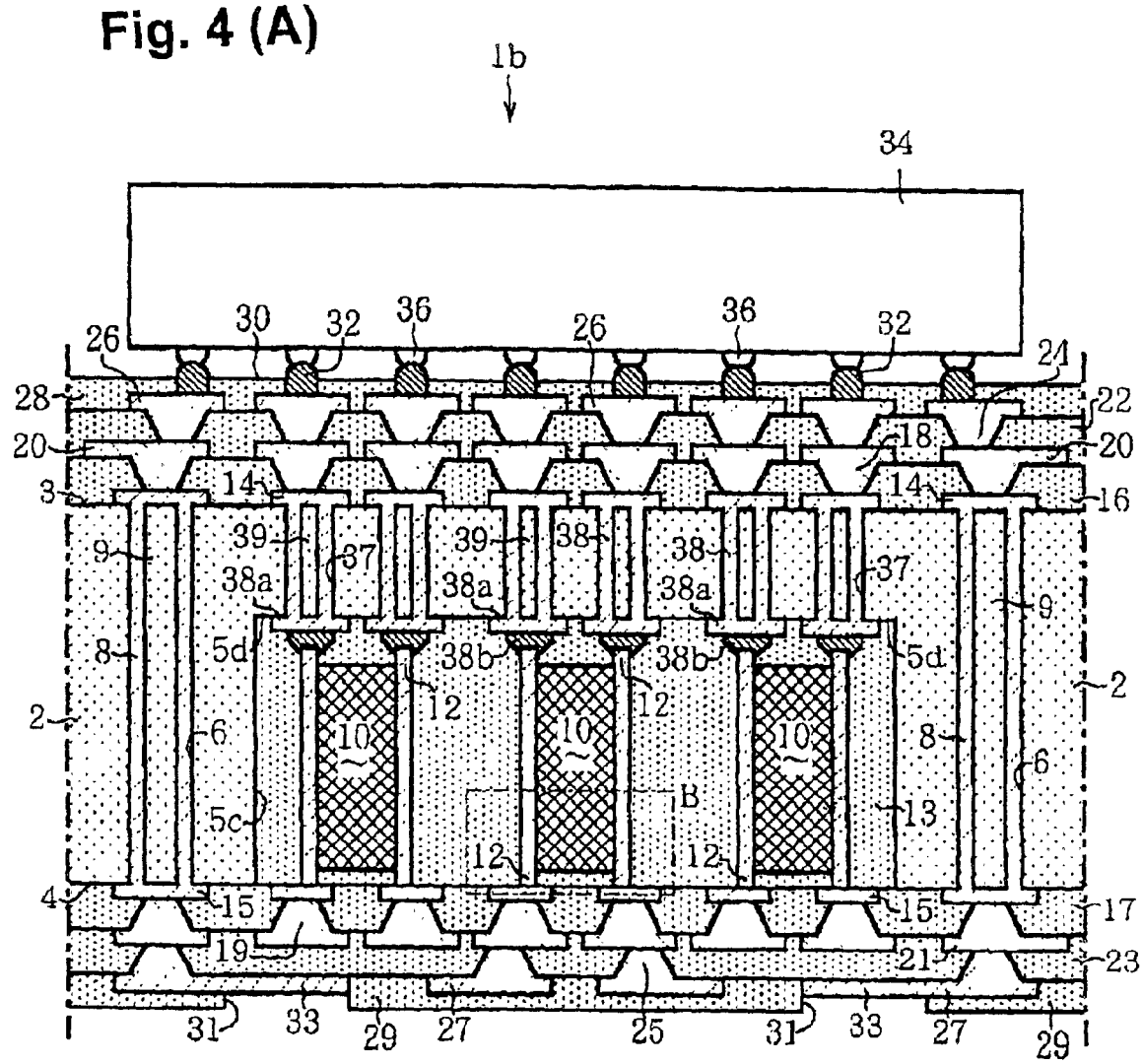
FIG. 4(A) is a sectional view showing a main portion of a printed wiring substrate according to a modification of the printed wiring substrate of FIG. 3(A)
FIG. 4(B) is an enlarged view of portion B enclosed by the dot-and-dash line in FIG. 1(A).
Figure 4:
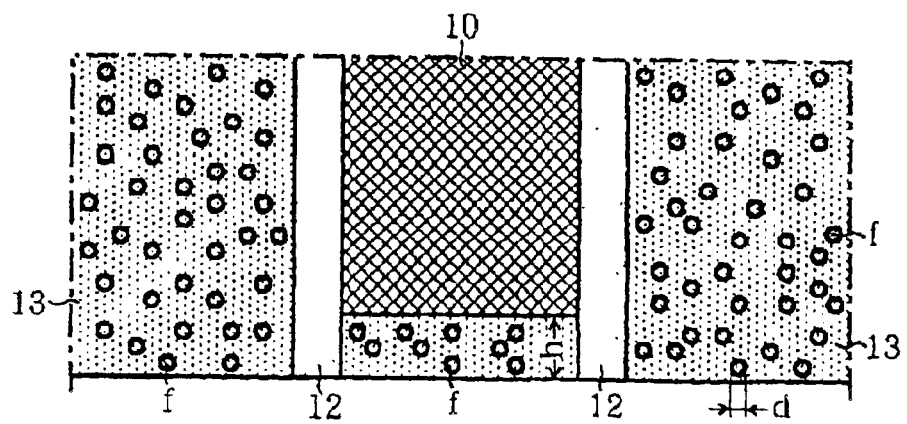

FIG. 4(A) is a sectional view showing a main portion of a printed wiring substrate 1b, or a modification of the printed wiring substrate 1a described above. A recess 5c having a substantially square shape of 12 mm×12 mm as viewed from above is formed, by means of a router, in the core substrate 2 of the printed wiring substrate 1b so as to extend from the interior of the core substrate 2 to the back surface 4. Through-holes 37 are formed in a portion of the core substrate 2 between a bottom surface (ceiling surface) 5d of the recess 5c and the front surface 3 of the core substrate 2. A through-hole conductor 38 filled with a filler resin 39 is formed inside each of the through-holes 37. A pad 38a is formed at the lower end of the through-hole conductor 38 and on the bottom surface 5d of the recess 5c. The pads 38a are connected via solder 38b to the corresponding electrodes 12 projecting from the upper end of the chip capacitors 10 (projecting toward an IC chip 34). As in the case of the embodiment described previously, the wiring layer 14 is disposed on the upper ends of the through-hole conductors 38 and on the front surface 3 of the core substrate 2.

As shown in FIG. 4(A), a plurality of chip capacitors 10 are disposed in the recess 5c such that the electrodes 12 projecting from the upper ends thereof are connected to the corresponding pads 38a via the solder 38b. Subsequently, as in the case of the embodiment described previously, the liquid epoxy resin 13a containing the silica filler f is filled into the recess 5c, followed by curing through application of heat. The liquid epoxy resin 13a becomes the resin 13. The surface of the resin 13 is polished for leveling in a manner similar to that of the previously described embodiment.

Subsequently, as shown in FIG. 4(A), the wiring layers 14, 20, 26, 15, 21, and 27, the dielectric layers 16, 22, 28, 17, 23, and 29, and the filled via conductors 18, 24, 19, and 25 are formed by a known build-up process, thereby yielding the printed wiring substrate 1b having the chip capacitors 10 embedded in the core substrate 2.

As shown in FIG. 4(B), the resin 13 used for embedding the chip capacitors 10 contains the silica filler f having a maximum particle size d of approximately 25 μm such that silica filler particles are distributed in a substantially uniform condition. The height h of the electrode 12 projecting from the lower end of the chip capacitor 10 is 50–100 μm. The maximum particle size d of the silica filler f is not greater than one-half the height h of the electrode 12, preferably not greater than one-third the height h.

As shown in FIG. 4(A), the electrodes 12 project by the height h from the upper end of each of the chip capacitors 10. The solder 38b and the electrodes 12 projecting from the upper ends of the chip capacitors 10 establish a sufficient gap between the chip capacitors 10 and the bottom surface 5d of the recess 5c, whereby the silica filler f is likely to enter the gap. In FIG. 4(A), the electrodes 12 projecting from the upper ends of the chip capacitors 10 are connected to the corresponding pads 38a via solder 38b. However, the form of connection is not limited thereto. For example, the electrodes 12 projecting from the upper ends of the chip capacitors 10 may be directly connected to the corresponding pads 38a.

In the printed wiring substrate 1b, the chip capacitors 10 embedded in the core substrate 2 may be such that the electrodes 12 project from the upper end thereof (toward the IC chip 34). When the chip capacitors 10 assume such a form, the chip capacitors 10 are electrically connected to wiring layers formed on and above the front surface 3, such as the wiring layer 14, via the through-hole conductors 8 extending through the core substrate 2.

The printed wiring substrates 1a and 1b are described while mentioning the core substrate 2 formed from a single-layer dielectric plate. However, the present invention is not limited thereto. The core substrate 2 may be configured such that a plurality of dielectric layers are arranged in a layered structure or such that a plurality of dielectric layers and a plurality of wiring layers are arranged in an alternatingly layered structure. Also, a through-hole may be formed beforehand in some of the plurality of dielectric layers so as to be formed into the recess 5a or 5c through formation of the remaining dielectric layers. Furthermore, the plurality of dielectric layers may be made of one or more materials.

In the printed wiring substrate 1b, the dielectric layers 17, 23, and 29, the wiring layers 21 and 27, and the filled via conductors 19 and 25 are formed on and under the back surface 4 of the core substrate 2 by a build-up process. However, no particular limitation is imposed on the form of the printed wiring substrate 1b. For example, the printed wiring substrate 1b may assume the form of a single sided printed wiring substrate in which the dielectric layer 29 and the wiring layer 15 (including the wiring pattern 33) are formed on the back surface 4 of the core substrate 2, while build-up layers are formed on and above the surface 3 of the core substrate 2.

FIGS. 5(A) to 5(D) show major steps of a method for manufacturing a printed wiring substrate 1c according to a different embodiment.

Figure 5:
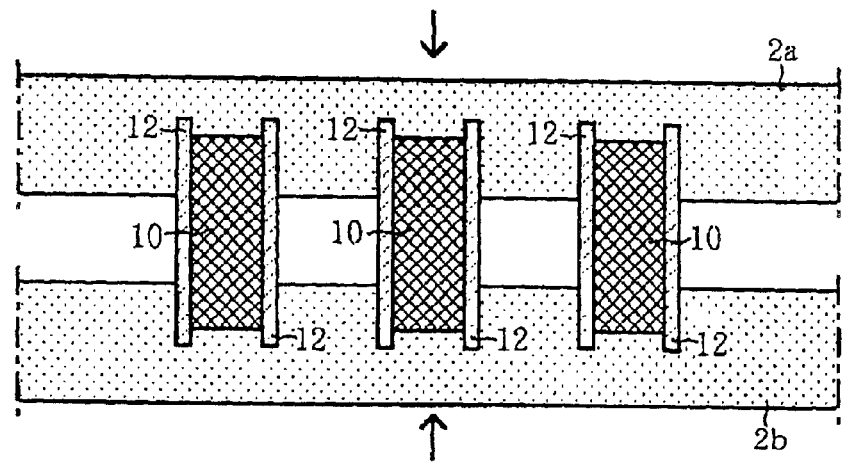
FIGS. 5(A) to 5(D) are schematic views showing major steps of a method for manufacturing a printed wiring substrate according to another embodiment of the present invention.
Figure 5:
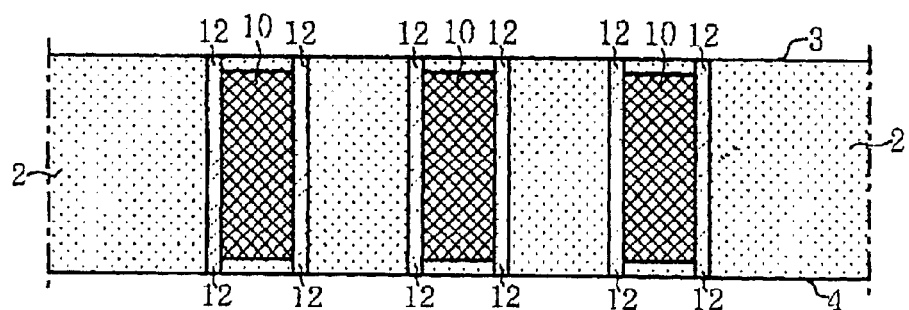
Figure 5:
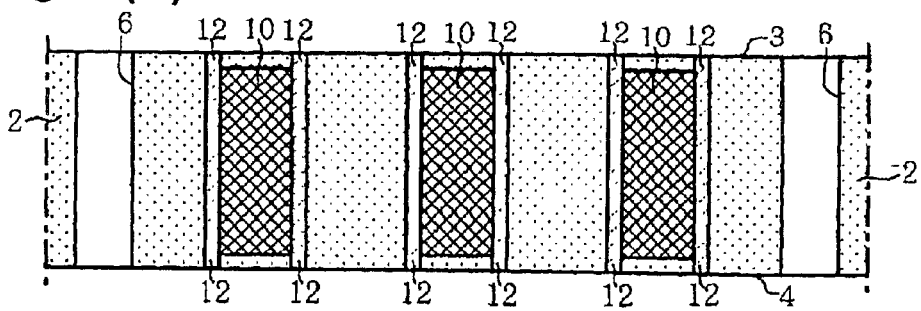
Figure 5:
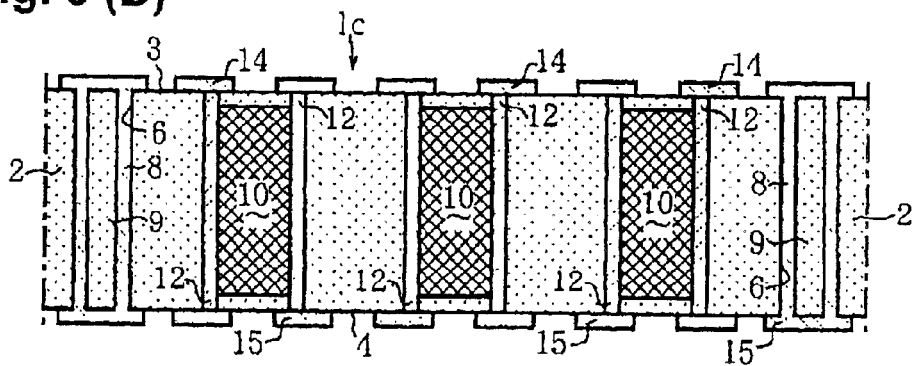
Figure 6:
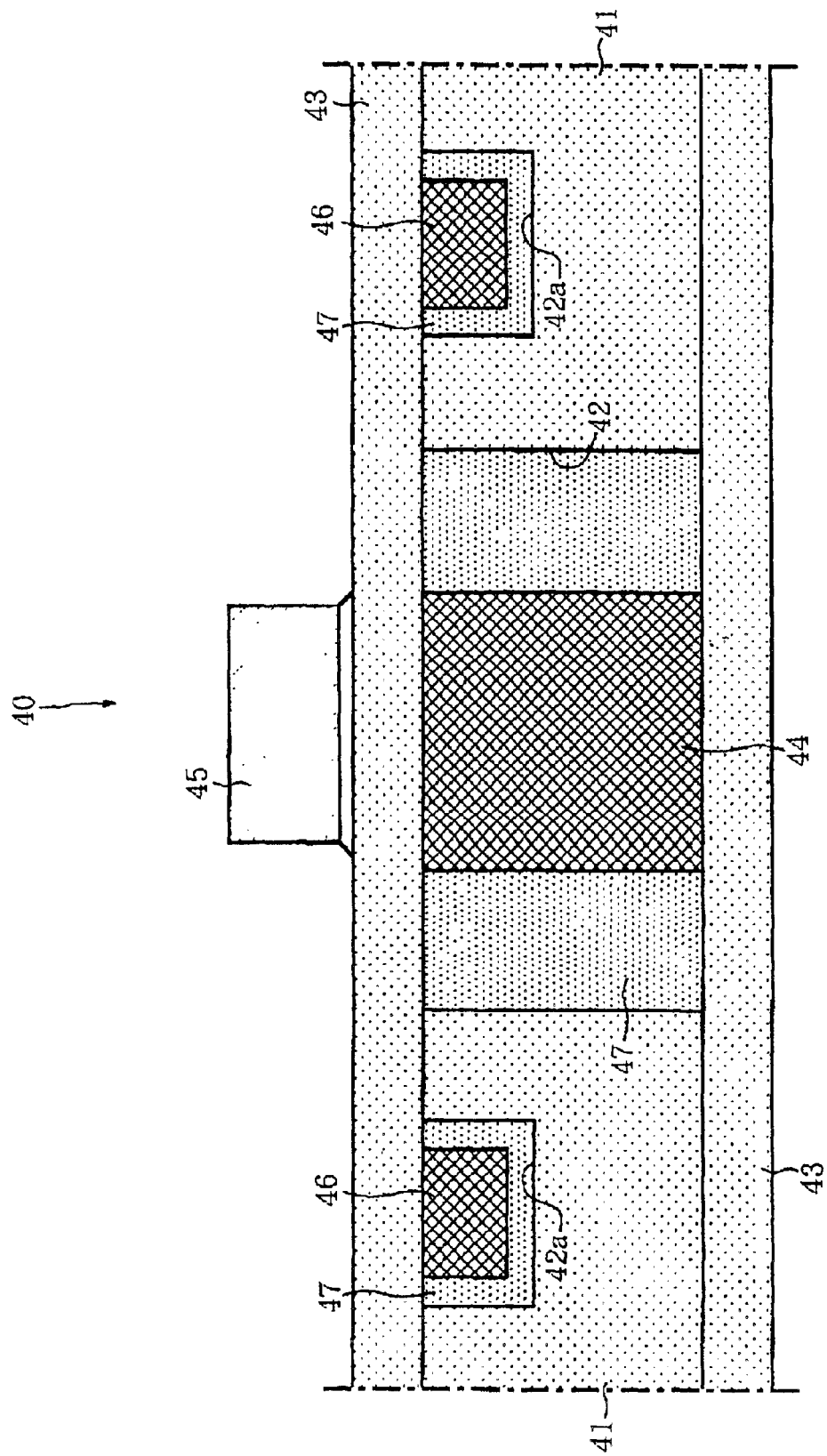
FIG. 6 is a sectional view showing a conventional printed wiring substrate.

FIG. 5(A) shows a plurality of chip capacitors 10 held between upper and lower resin sheets 2a and 2b made of BT resin and containing the silica filler f having a maximum particle size of approximately 25 μm. The height h of the electrodes 12 projecting from the upper and lower ends of the chip capacitors 10 is 75 μm. The maximum particle size of the silica filler f is not greater than one-half the height h, preferably not greater than one-third the height h. The thickness of each of the resin sheets 2a and 2b is approximately one-half the overall height of the chip capacitor 10. As indicated by the arrows in FIG. 5(A), the resin sheets 2a and 2b are pressed vertically so as to approach each other while being heated. As a result, as shown in FIG. 5(B), the resin sheets 2a and 2b are fused together and fill the gaps between the chip capacitors 10, thereby yielding the core substrate 2 of a single body.

As shown in FIGS. 1(B) and 3(B), even in a thin resin portion extending between the upper end of the chip capacitor 10 and the front surface 3 of the core substrate 2 and between the lower end of the chip capacitor 10 and the back surface 4 of the core substrate 2, lack of the silica filler f does not occur, and the silica filler f serves as an aggregate to reinforce the core substrate 2 and lowers the coefficient of thermal expansion of the core substrate 2. Accordingly, as shown in FIG. 5(B), cracking is unlikely to occur in the thin resin portion of the core substrate 2 located in the vicinity of the electrodes 12 extending through the thin resin portion, whereby the chip capacitors 10 can be embedded in the core substrate 2 while being insulated and hermetically sealed.

Next, as shown in FIG. 5(C), through-holes 6 are formed in the core substrate 2 at predetermined positions. Subsequently, a copper plating layer is formed on the walls of the through-holes 6 and on the front and back surfaces 3 and 4 of the core substrate 2, followed by photolithographic processing. As a result, as shown in FIG. 5(D), a printed wiring substrate 1c is obtained including through-hole conductors 8 and wiring layers 14 and 15.

The printed wiring substrate 1c does not require formation of the through-hole 5 and the recesses 5a and 5c in the core substrate 2 and thus does not require filling of the resin 13a into the through-hole 5 and the recesses 5a and 5c. The chip capacitors 10 can be embedded in the core substrate 2 in the following manner: the resin sheets 2a and 2b containing the silica filler f are disposed with a plurality of chip capacitors 10 held therebetween, and then pressure and heat are applied to the resin sheets 2a and 2b to thereby integrate the resin sheets 2a and 2b into the core substrate 2 having the chip capacitors 10 embedded therein. Accordingly, the chip capacitors 10 can be embedded in the core substrate 2 while being insulated and hermetically sealed. Needless to say, the wiring layers 20, 26, 21, and 27, the dielectric layers 16, 22, 28, 17, 23, and 29, and the filled via conductors 18, 24, 19, and 25 may be formed on the printed wiring substrate 1c by a known build-up process, to thereby yield a multilayer printed wiring substrate similar to the printed wiring substrate 1 shown in FIG. 1(A).

The present invention is not limited to the above-described embodiments.

For example, a single electronic component may be embedded in the through-hole 5, the recess 5a or 5c, or the core substrate 2. Alternatively, a plurality of through-holes 5 or a plurality of recesses 5a or 5c may be formed in each area, corresponding to a single product, of a panel including a large number of core substrates 2.

Also, another type of an electronic component like the chip capacitor 10 having the electrode 12 projecting from the upper end (projecting toward the IC chip 34) may be embedded in the through-hole 5 formed in the core substrate 2.

Furthermore, a plurality of chip-type electronic components bonded side by side into a single unit may be embedded in the through-hole 5 or the recess 5a or 5c.

Examples of chip-type electronic components include not only the chip capacitor 10 but also chip-type passive components, such as inductors, resistors, and filters, and chip-type active components, such as transistors, memories, and low noise amplifiers (LNA). Electronic components of different kinds may be embedded in the same through-hole, the same recess, or the same core substrate.

The connection between a wiring layer and electrodes of an electronic component may be established on both the front and back surfaces 3 and 4 of the core substrate 2 or on either the front surface 3 or the back surface 4.

Material for the core substrate 2 is not limited to the above-mentioned BT resin. The core substrate 2 may be made of glass woven fabric or glass-fiber-resin-type composite material having heat resistance, mechanical strength, flexibility, and machinability similar to those of BT resin. The glass-fiber-resin-type composite material includes glass fiber, such as glass wove fabric, and resin, such as epoxy resin, polyimide resin, or BT resin. Alternatively, a composite material may be used composed of organic fiber, such as polyimide fiber, and resin or a resin-resin-type composite material formed of a fluoro-resin having a three-dimensional network structure, such as continuously porous PTFE, and impregnated with a resin, such as epoxy resin.

A process for forming the wiring layers 14 and 15 is not limited to copper plating. Ni or Ni—Au plating may be employed. Alternatively, in place of metal plating, a conductive resin may be applied.

The form of the via conductor 18 is not limited to a filled via; i.e., to the form of filling a via hole with conductor. A conical form corresponding to the shape of a via hole may be employed.

Material for the dielectric layers 16 and 17 is not limited to the aforementioned material containing a predominant amount of epoxy resin. The dielectric layers 16 and 17 may be made of other resins and materials having similar heat resistance and patternable properties, such as polyimide resin; BT resin; PPE resin; and a resin-resin-type composite material formed of a fluoro-resin having a three-dimensional network structure, such as continuously porous PTFE, and impregnated with a resin, such as epoxy resin. Examples of methods for forming a dielectric layer include application of liquid resin by means of a roll coater and thermocompression bonding of a dielectric film.

The chip capacitor 10 is made from high-dielectric-constant ceramic containing a predominant amount of $BaTiO_3$. However, the chip capacitor 10 may also be made from ceramic containing a predominant amount of $PbTiO_3$, $PbZrO_3$, $TiO_2$, $SrTiO_3$, $CaTiO_3$, $MgTiO_3$, $KNbO_3$, $NaTiO_3$, $KTaO_3$, $PbTaO_3$, $(Na_{1/2}Bi_{1/2})TiO_3$, $Pb(Mg_{1/2}W_{1/2})O_3$, or $(K_{1/2}Bi_{1/2})TiO_3$.

The material for the electrode 12 of the chip capacitor 10 contains a predominant amount of Cu. However, the electrode 12 may also be made from a material compatible with an electronic component, such as Pt, Ag, Ag—Pt, Ag—Pd, Pd, Au, and Ni.

The chip capacitor 10 serving as an electronic component may also assume the form of a composite capacitor consisting of a dielectric layer containing a predominant amount of high-dielectric-constant ceramic, an electrode layer made from Ag—Pd or the like, and a via conductor and a wiring layer made from resin and Cu plating or Ni plating.

Notably, a plurality of mounting areas may be formed on the first main surface 30 of each of the printed wiring substrates 1, 1a and 1b so as to mount a plurality of IC chips 34 on the respective mounting areas.

The printed wiring substrate of the present invention (first and second embodiments) yields the following effects. Cracking does not occur in a resin used for embedding an electronic component. Particularly, a thin resin portion adjacent to the upper or lower end of the electronic component from which an electrode projects is unlikely to suffer cracking and separation. Thus, the electronic component can be embedded in a through-hole or a recess formed in a core substrate while being insulated and hermetically sealed, and thus can reliably function as expected. Also, electrical continuity can be stably established via the electrode between the electronic component and a wiring layer formed in the printed wiring substrate.

The printed wiring substrate of the third embodiment yields the following effects. Since the core substrate, in which an electronic component is embedded, contains a reinforcing inorganic filler, cracking is unlikely to occur in a portion of the core substrate around the electronic component. Particularly, cracking or separation is unlikely to occur at a thin portion of the core substrate adjacent to the upper or lower end of the electronic component from which an electrode projects. Thus, the electronic component can be embedded in the core substrate such that good dielectric performance and good hermetic performance are maintained. Accordingly, the electronic component can reliably function as expected, and electrical continuity can be stably established via the electrode between the electronic component and a wiring layer formed in the printed wiring substrate.

The printed wiring substrate of the fourth and fifth embodiments yields the following effects. Because the thin resin portion or a thin portion of the core substrate adjacent to the upper or lower end of an electronic component from which an electrode projects is reinforced, cracking can be reliably prevented which would otherwise result from thermal expansion or contraction.

The method for manufacturing a printed wiring substrate of the present invention reinforces a thin resin portion or a thin portion of the core substrate adjacent to the upper or lower end of an electronic component from which an electrode projects, thereby reliably providing a printed wiring substrate unsusceptible to cracking.

This application is based on Japanese Patent Application No. 2000–231985 filed Jul. 31, 2000, the disclosure of which is incorporated herein by reference in its entirety.

What is claimed is:

1. A primed wiring substrate comprising:
   a core substrate having a front surface and a back surface;
   an electronic component embedded in said core substrate;
   said electronic component having an electrode having a height projecting from at least an upper end thereof;
   a dielectric layer covering the front surface of the core substrate;
   terminal electrodes for mounting a semiconductor element on the from surface of the primed wiring substrate: and
   via holes penetrating the insulating layer and connections at least one of the terminal electrodes to the electrode of the electronic component, wherein said core substrate or a resin embedding the electronic component in the core substrate contains an inorganic filler.

2. The printed wiring substrate as claimed in claim 1, wherein the inorganic filler has a particle size not greater than 25 $\mu$m, and the electrode has a height of at least 50 $\mu$m.

3. The printed wiring substrate as claimed in claim 1, wherein said electronic component is embedded in the core substrate via a resin in a through-hole extending through said core substrate between the front surface and the back surface of the core substrate, and the resin contains said inorganic filler.

4. The printed wiring substrate as claimed in claim 3, wherein the inorganic filler has a particle size not greater than 25 $\mu$m. and the electrode has a height of at least 50 $\mu$m.

5. The printed wiring substrate as claimed in claim 1, wherein said electronic component is embedded in the core substrate via a resin in a recess formed in said core substrate and extending from an interior of said core substrate to the front surface or back surface of the core substrate, and the resin contains said inorganic filler.

6. The printed wiring substrate as claimed in claim 5, wherein the inorganic filler has a particle size not greater than 25 $\mu$m, and the electrode has a height of at least 50 $\mu$m.

7. A method for manufacturing a printed wiring substrate comprising a core substrate having a front surface and a back surface:

an electronic component embedded in said core substrate via a resin in a through-hole extending through said core substrate between the front surface and the back surface of the core substrate, said electronic component having an electrode having a height projecting front at least an upper end thereof:

a dielectric layer covering the front surface of the core substrate:

terminal electrodes for mounting a semiconductor element on the front of the printed wiring substrate; and via conductors penetrating the insulating layer and connecting at least one of the terminal electrodes to the electrode of the electronic component, wherein said resin embedding the electronic component in the core substrate contains an inorganic filler, said method comprising the steps of:

inserting into the through-hole the electronic component having an electrode projecting from at least thereof;

embedding the electronic component in the through-hole by means of a resin containing an inorganic filler; and polishing a surface of the resin so as to expose an end surface of the electrode.

8. A method for manufacturing a printed wiring substrate comprising a core substrate having a front surface and a back surface:

an electronic component embedded in said core substrate via a resin in a recess formed in said core substrate and extending from an interior of said core substrate to the front surface or back surface of the core substrate.

said electronic component having an electrode having a height projecting from at least an upper end thereof:

a dielectric layer covering the front surface of the core substrate:

terminal electrodes for mounting a semiconductor element on the front surface of the printed wiring substrate: and via conductors penetrating the insulating layer and connecting at least one of the terminal electrodes to the electrode of the electronic component, wherein said resin embedding the electric component in the core substrate contains an inorganic filler, said method comprising the steps of:

inserting into the through-hole or the recess the electronic component having an electrode projecting from at least an upper end thereof:

embedding the electronic component in the recess by means of a resin containing an inorganic filler; and polishing a surface of the resin so as to expose an end surface of the electrode.

* * * * *